(12) United States Patent
Korsunsky et al.

(10) Patent No.: US 6,875,031 B1
(45) Date of Patent: Apr. 5, 2005

(54) ELECTRICAL CONNECTOR WITH CIRCUIT BOARD MODULE

(75) Inventors: Iosif R. Korsunsky, Harrisburg, PA (US); Chong H. Yi, Mechanicsburg, PA (US); Tod M. Harlan, Mechanicsburg, PA (US); Eric D. Juntwait, Hummelstown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/728,536

(22) Filed: Dec. 5, 2003

(51) Int. Cl.$^7$ .............................................. H01R 12/00
(52) U.S. Cl. ...................... 439/79; 439/608; 439/76.1; 439/650
(58) Field of Search .............. 439/76.1, 79, 607–608, 439/650–654

(56) References Cited

U.S. PATENT DOCUMENTS

| | | | |
|---|---|---|---|
| 5,980,321 A | 11/1999 | Cohen et al. | |
| 6,083,047 A | 7/2000 | Paagman | |
| 6,171,115 B1 | 1/2001 | Mickievicz et al. | |
| 6,267,604 B1 | 7/2001 | Mickievicz et al. | |
| 6,638,079 B1 * | 10/2003 | Billman et al. | 439/76.1 |
| 6,655,966 B2 * | 12/2003 | Rothermel et al. | 439/76.1 |
| 6,709,298 B2 * | 3/2004 | Bradley | 439/701 |

* cited by examiner

*Primary Examiner*—Truc Nguyen
(74) *Attorney, Agent, or Firm*—Wei Te Chung

(57) ABSTRACT

An electrical connector (100) includes a unitary insulative housing (1) defining a number of parallel slots (13), a number of parallelly arranged circuit board modules (3) and a shield member (2) attached to the housing. The circuit board modules are retained by and between the shield member and the housing. Each circuit board module includes a dielectric spacer (30), a circuit board (36) attached to the dielectric spacer and received in a corresponding slot of the housing, and a row of press-fit contacts (38) mechanically and electrically connecting with the circuit board and disposed in the corresponding slot.

14 Claims, 10 Drawing Sheets

ELECTRICAL CONNECTOR WITH CIRCUIT BOARD MODULE

CROSS-REFERENCE TO RELATED APPLICATIONS

Relevant subject matter is disclosed in U.S. patent application Ser. No. 10/165,561 filed on Jun. 7, 2002 and entitled "HIGH SPEED, HIGH DENSITY BACKPLANE CONNECTOR" and Ser. No. 10/651,932 filed on Aug. 29, 2003 and entitled "ELECTRICAL CONNECTOR HAVING ENHANCED ELECTRICAL PERFORMANCE".

BACKGROUND OF THE INVENTION

1. Field of the Invention

The present invention relates to an electrical connector, and particularly to a high speed electrical connector having plural circuit board modules.

2. Description of Related Art

With the development of communication and computer technology, high density electrical connectors with conductive elements in a matrix arrangement are desired to construct a large number of signal transmitting paths between two electronic devices. Such high density electrical connectors are widely used in internal connecting systems of severs, routers and the like requiring high speed data processing and communication.

Due to continuing trends toward miniaturization and improved electrical performance by the electronics industry, requirements for greater contact density and higher electrical speeds are constantly being promulgated. This results in an increasing number of signals in the limited space of the connector. As the signal circuits are spaced closer and the transmission speed of the signals increases, electromagnetic inference (EMI) and the crosstalk become a serious problem.

U.S. Pat. Nos. 6,171,115 and 6,267,604, both issued to Mickievicz et al., each disclose a high speed connector having plural individual circuit boards to reduce crosstalk. The connector comprises a front housing portion having a front wall with a plurality of parallel apertures extending therethrough, and an organizer attached to the front housing portion to retain the plural individual circuit boards therebetween. The organizer has a plurality of spaced slots located corresponding to the apertures, and a plurality of openings communicating with the slots in a bottom wall thereof. The circuit boards have mating portions extending through the apertures of the front housing portion for mating with a complementary connector, and mounting edges received in the slots of the organizer. The mounting edges of the circuit boards have a plurality of terminals secured thereon by soldering. The terminals extend through respective openings of the organizer for electrically connecting with a circuit substrate.

U.S. Pat. No. 6,083,047 issued to Paagman, discloses a high speed connector having plural terminal modules retained to an insulating housing thereof. Each of the terminal modules comprises a dielectric cover and a printed circuit board (PCB) assembly associated with the dielectric cover. The PCB assembly includes an insulating substrate having a mating edge and a mounting edge perpendicular to each other, a plurality of circuit traces extending from the mating edge to the mounting edge, a plurality of socket terminals soldered to the mating edge for engaging with a complementary connector, and a plurality of press-fit terminals soldered to the mounting edge for connection to a printed circuit board on which the connector is mounted. Each press-fit terminal has a compliant tail which can be compressed upon insertion of the press-fit terminal into a corresponding through hole of the printed circuit board and then tends to restore to its original shape to engage surfaces within the through hole to thereby hold the connector on the printed circuit board. The press-fit terminal with a high retention force typically requires a high insertion force, which results in that the press-fit terminal is easy to deflect during the insertion of the press-fit terminal into the through hole of the circuit board. As a result, the connector is unreliably positioned on the printed circuit board and an electrical connection is adversely affected between the connector and the printed circuit board.

On the other hand, there exists a common disadvantage in the above-mentioned patents that the electromagnetic interference are still not solved. The high speed electrical connector equipped with shielding to reduce EMI can be referred to U.S. Pat. No. 5,980,321 (hereinafter the '321 patent). The connector disclosed in the '321 patent comprises a plurality of wafers side-by-side stacked and a metal stiffer holding the wafers in a required position. Each wafer is made in two pieces, a shield piece and a signal piece. The shield piece is formed by insert molding housing around a front portion thereof. The signal piece is made by insert molding housing around contacts. In order to hold each wafer in the required position without rotation, three connection points are established between the metal stiffer and the wafer. The connection comprises projections formed on the wafer and corresponding slots defined in the stiffer. However, the projections must be accurately aligned with corresponding slots, respectively, thereby complicating the manufacture of the connector as well as the assembly thereof. Further, the arrangement of positioning the shield pieces between the adjacent signal pieces reduces the effective signal density.

Hence, an improved electrical connector is required to overcome the disadvantages of the related art.

SUMMARY OF THE INVENTION

Accordingly, a first object of the present invention is to provide a high density electrical connector having enhanced electrical performance with a simplified configuration.

A second object of the present invention is to provide a high density electrical connector having plural press-fit contacts which can reliably connect with a printed circuit board to which the connector is mounted.

In order to achieve the objects set forth, a high density electrical connector in accordance with the present invention comprises a unitary insulative housing defining a plurality of parallel slots, a plurality of parallelly arranged circuit board modules and a shield member attached to the housing. The circuit board modules are retained by and between the shield member and the housing. Each circuit board module includes a dielectric spacer, a circuit board attached to the dielectric spacer and received in a corresponding slot of the housing, and a row of contacts mechanically and electrically connecting with the circuit board and disposed in the corresponding slot.

According to one aspect of the present invention, the circuit board has a mounting portion received in the slot and with a fusible element disposed thereon. The mounting portion defines a plurality of plated through holes therein. Each contact includes an intermediate portion, a connecting portion extending upwardly from the intermediate portion and surface mounted to the mounting portion, and a tail portion extending downwardly from the intermediate portion adapted for connecting with a printed circuit board. The connecting portion has a projection received in the plated through hole. Interstitial space between the plated through hole and the projection is substantially filled with fusible element after melting and solidifying the fusible element.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
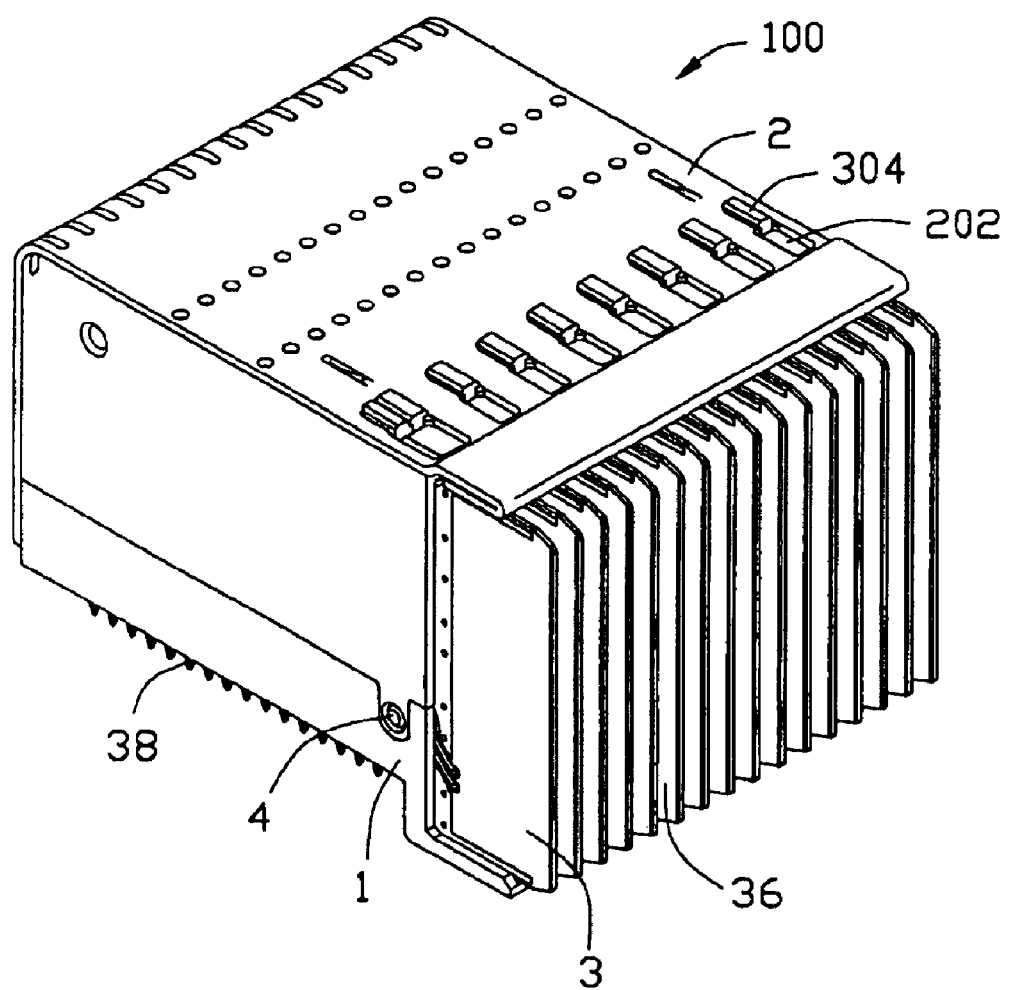
FIG. 1 is an assembled perspective view of an electrical connector in accordance with the present invention.
Figure 2:
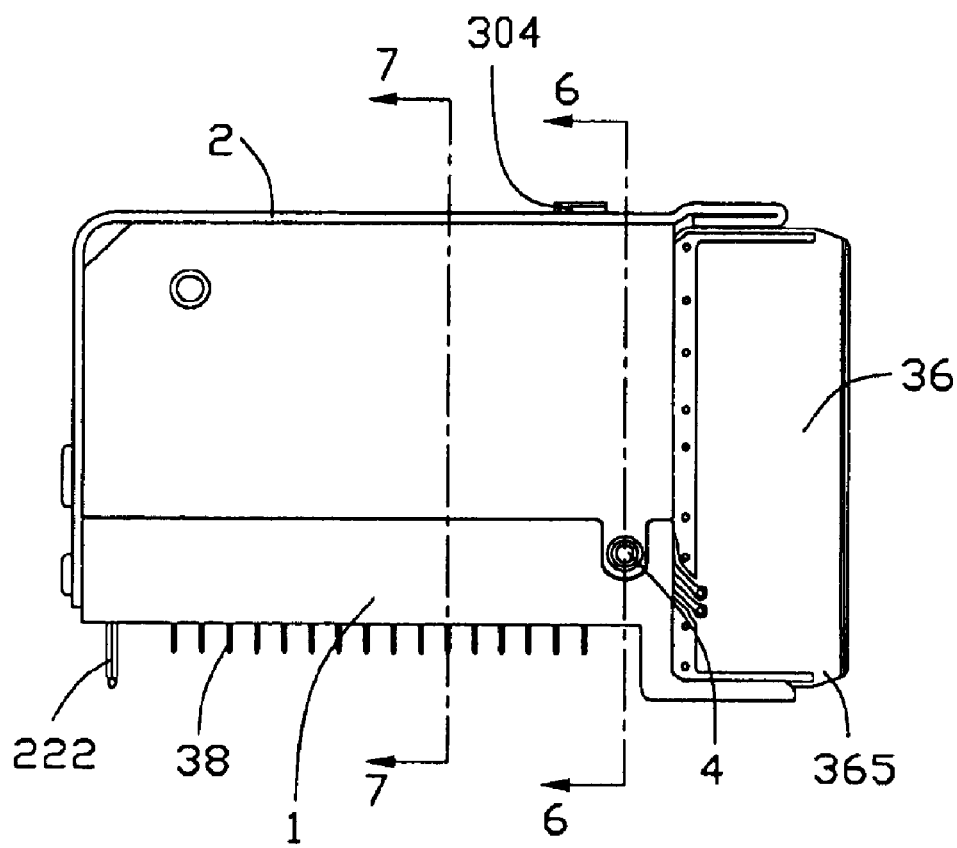
FIG. 2 is a side elevation view of the electrical connector shown in FIG. 1.
Figure 3:
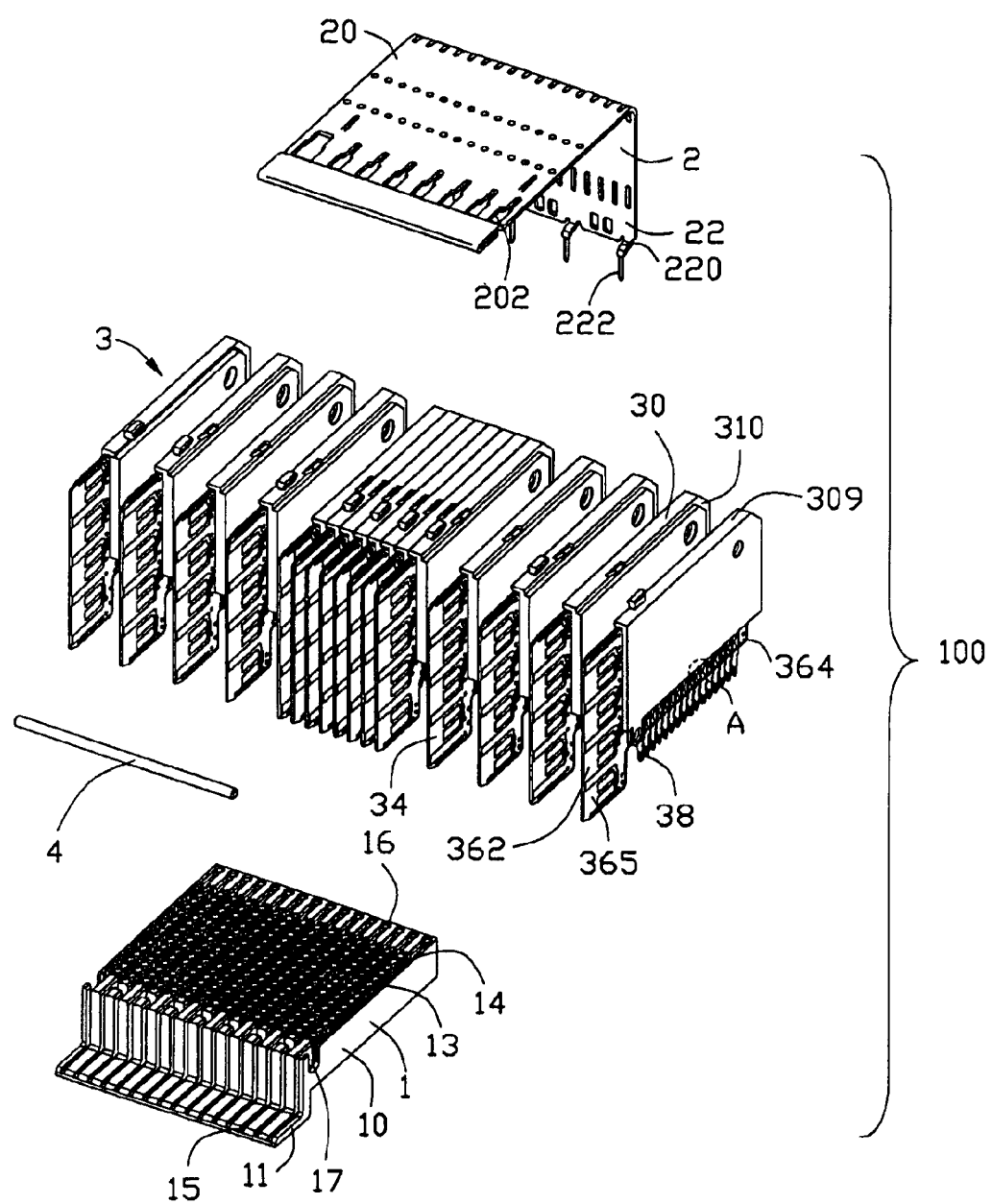
FIG. 3 is an exploded perspective view of the connector shown in FIG. 1.

Referring to FIGS. 1, 2 and 3, an electrical connector 100 in accordance with the present invention comprises a unitary insulating housing 1, a shield member 2, a plurality of individual circuit board modules 3 received in the housing 1, and an alignment pin 4 inserting through the circuit board modules 3. The shield member 2 substantially encloses the housing 1 and the circuit board modules 3 for electromagnetic interference (EMI) protection.

The housing 1 includes a rectangular body 10 and a front tongue 11 extending forwardly from a lower portion of a front end of the body 10. The body 10 defines a plurality of parallel slots 13 extending along a longitudinal direction of the housing 1, and plural rows of passageways 14 communicating with corresponding slots 13 and penetrating through a bottom thereof. The tongue 11 defines a plurality of grooves 15 aligned with corresponding slots 13. The housing 2 defines a row of holes 16 at a rear end thereof and a bore 17 laterally extending therethrough.

The shield member 2 is stamped from a metal sheet and comprises a top plate 20 and a rear plate 22 extending downwardly from a rear edge of the top plate 20. The top plate 20 defines a plurality of slots 202 adjacent a front edge thereof. The rear plate 22 is formed with a plurality of fastening tabs 220 extending forwardly from a bottom edge thereof for being retained in corresponding recesses (not shown) of the housing 1 and a plurality of positioning fingers 222 extending downwardly from corresponding tabs 220 for insertion into corresponding through holes of a printed circuit board (PCB) to which the connector 100 is mounted for positioning the connector 100 on the PCB.

Figure 5:
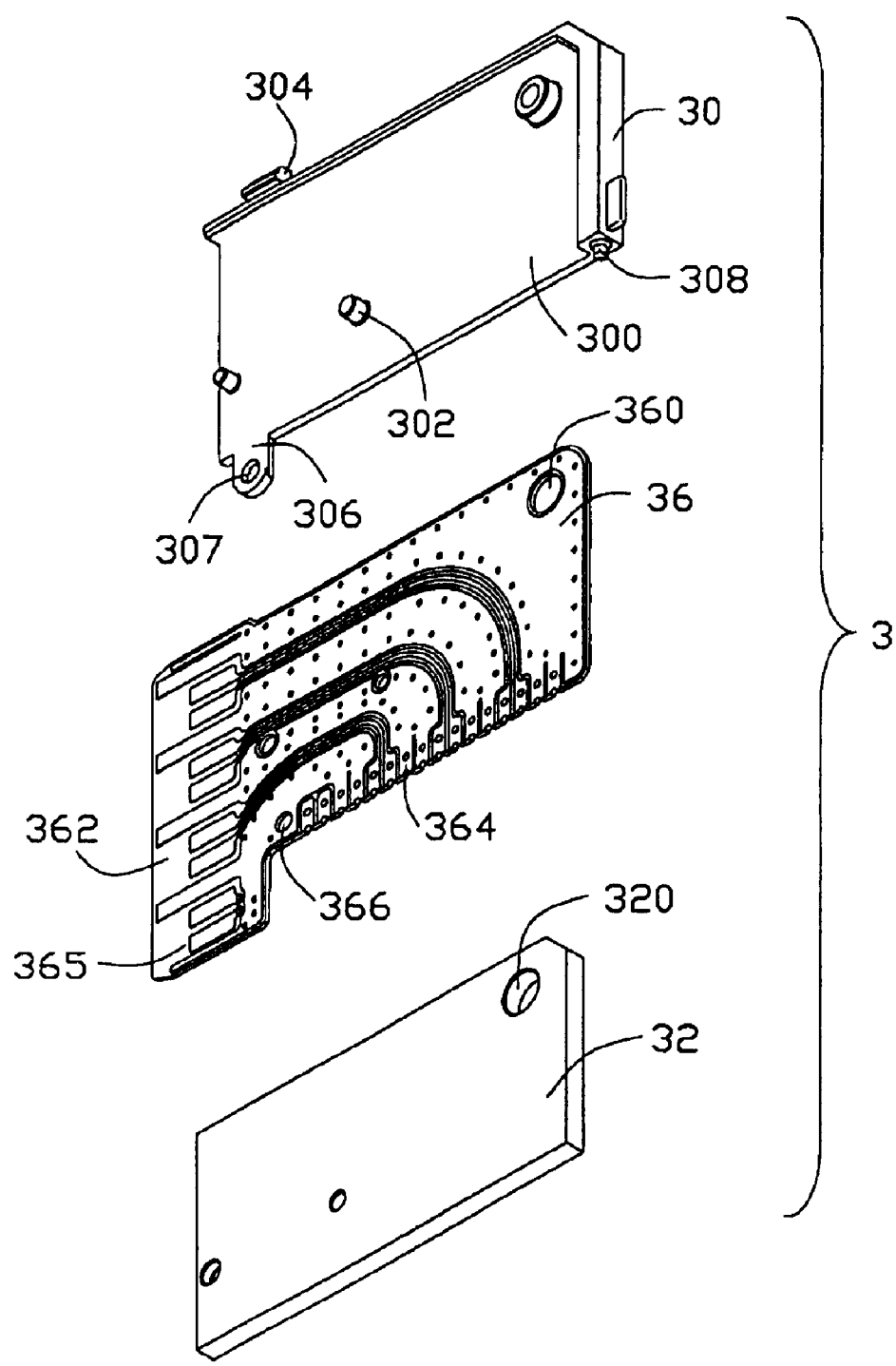
FIG. 5 is an exploded perspective view of a circuit board module used in the connector with press-fit contacts being omitted.

The individual circuit board modules 3 are side-by-side stacked. In a preferred embodiment, each one of the circuit board modules 3 is substantially identical in structure except for a left outermost one of FIG. 3. As best shown in FIG. 5, the left outermost circuit board module 3 comprises a dielectric spacer 30, a dielectric block 32 and a circuit board assembly 34 securely sandwiched between the dielectric spacer 30 and the dielectric block 32. The dielectric spacer 30 is a flat plate and defines a recess 300 in a first side thereof receiving the circuit board assembly 34. The dielectric spacer 30 includes a plurality of laterally extending posts 302 in the recess 300, a T-shaped protrusion 304 on a top edge thereof, a tab 306 with an opening 307 defined therein extending downwardly from a bottom edge adjacent a front end thereof, and a positioning pin 308 extending downwardly from the bottom edge adjacent a rear end thereof. The circuit board assembly 34 includes a circuit board 36 and a plurality of press-fit contacts 38 (shown in FIG. 3) electrically and mechanically connecting with the circuit board 36. The circuit board 36 defines a corresponding number of retention holes 360 receiving the posts 302 of the dielectric spacer 30 to thereby secure the circuit board assembly 34 with the dielectric spacer 30. The dielectric block 32 defines a corresponding number of through holes 320 receiving the posts 302 of the dielectric spacer 30 to thereby sandwich the circuit board assembly 34 between the dielectric spacer 30 and the dielectric block 32.

Referring again to FIG. 3, each of the other circuit board modules 3 has a structure substantially the same as the left outermost one except that the dielectric block 32 is not introduced and the recess 300 is defined in a second opposite side of the dielectric spacer 30. Every two adjacent circuit board modules 3 are side to side stackable with use of extended posts 309 (only one is shown) on one of the two adjacent dielectric spacers 30 and recessed holes 310 in another of the two adjacent dielectric spacers 30.

The circuit board 36 has a mating portion 362 extending beyond the front edge of the dielectric spacer 30 and a mounting portion 364 extending beyond the bottom edge of the dielectric spacer 30. The circuit board 36 includes a dielectric substrate made of conventional circuit board substrate material, such as FR4, and signal and grounding traces on the substrate. The signal and the grounding traces of the circuit board 36 provide electrical paths from the mating portion 362 to the mounting portion 364. Each of the circuit boards 36 defines a through hole 366 aligned with the bore 17 of the housing 1 and the opening 307 of the dielectric spacer 30. It is noted that the T-shaped protrusion 304 may be formed on every other dielectric spacer 30 rather than on each dielectric spacer 30.

Figure 6:
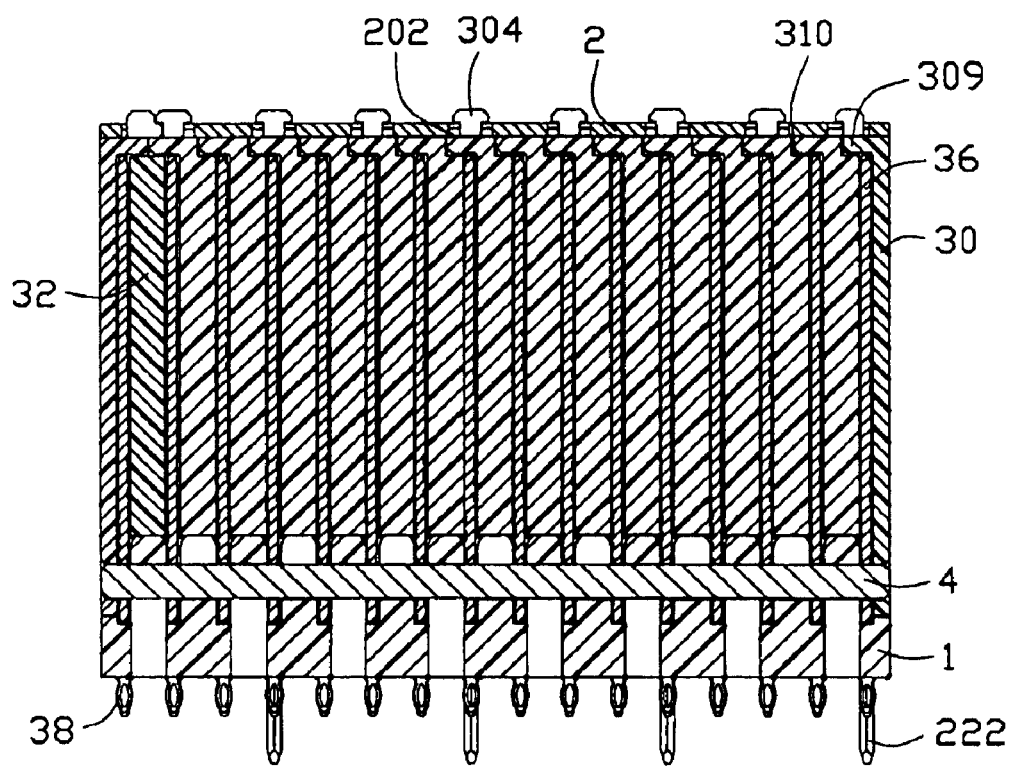
FIG. 6 is a cross-section view of the connector taken along line 6—6 of FIG. 2.
Figure 7:
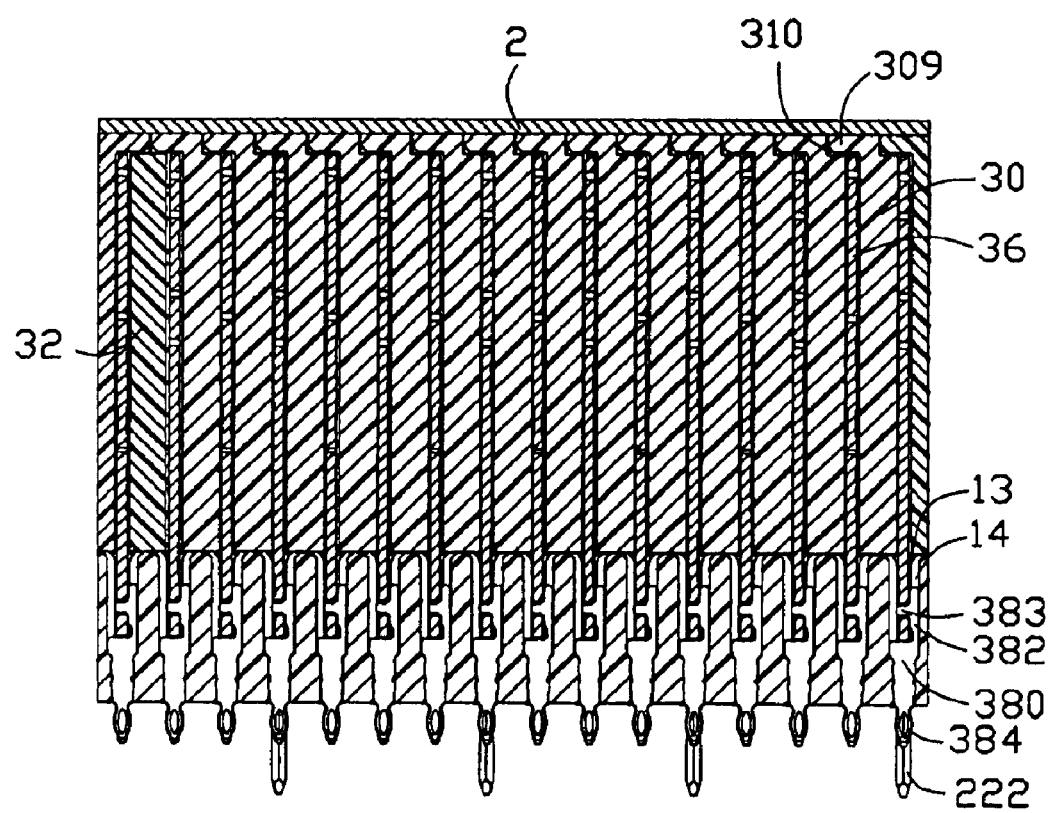
FIG. 7 is a cross-section view of the connector taken along line 7—7 of FIG. 2.

Referring to FIGS. 6 and 7 in conjunction with FIG. 3, the circuit board modules 3 are first installed in the shield member 2 with the protrusions 304 received in corresponding slots 202 and then are assembled to the housing 1 by locating the positioning pins 308 in the holes 16 and inserting the mounting portions 364 into the slots 13. The press-fit contacts 38 are received in the passageways 14 of the housing 1 and extend beyond the bottom of the housing 1 for being press-fitted into corresponding plated through holes of the PCB. The circuit boards 36 have front, lower edges 365 received in the grooves 15 of the housing 1. After the circuit board modules 3 are assembled to the housing 1, the alignment pin 4 inserts through the bore 17 of the housing 1, the openings 307 of the dielectric spacers 30 and the through holes 366 of the circuit boards 36, thereby providing an accurate position of the mating portions 362 of the circuit boards 36.

Figure 8:
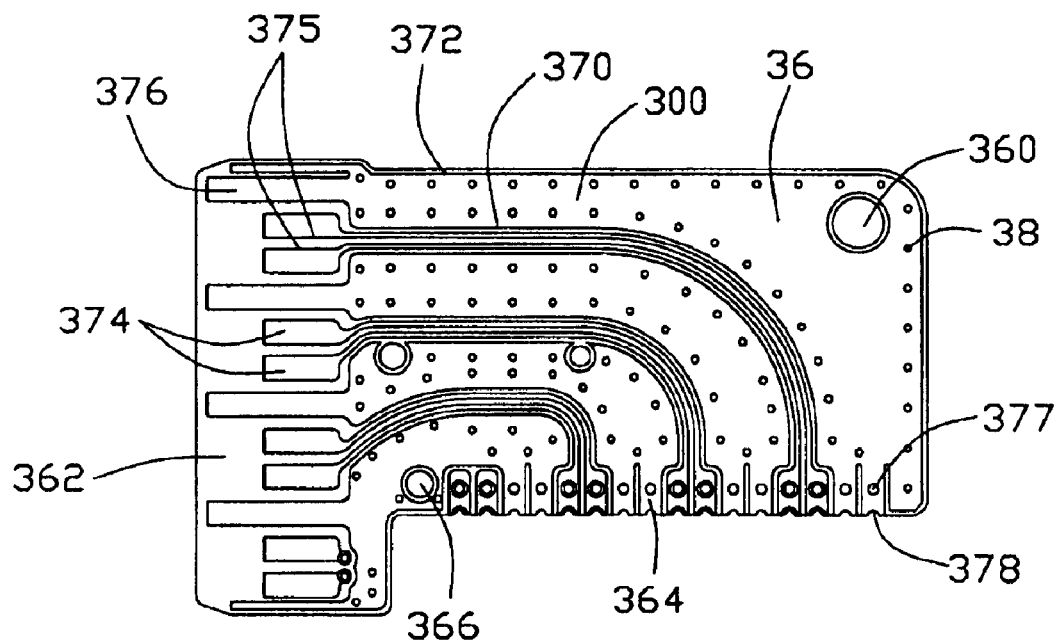
FIG. 8 is a first side elevation view of a circuit board that may be used in the connector.
Figure 9:
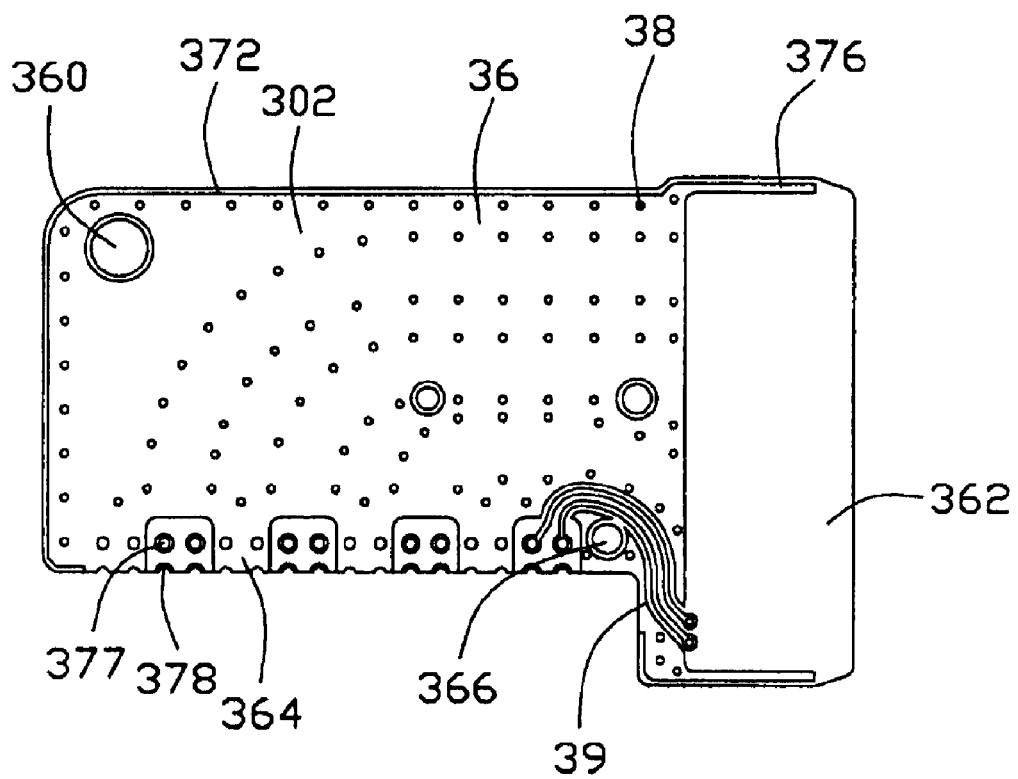
FIG. 9 is a second side elevation view of the circuit board.

FIGS. 8 and 9 show opposite faces of the circuit board 36 that may be used in the connector 100. On a first face 300 of each circuit board 36 are alternating signal traces 370 and grounding traces 372, and on a second face 302 of each circuit board 36 are only the grounding traces 372.

Each circuit board 36 has conductive pads on the mating portion 362 which are allocated as signal pads 374 and grounding pads 376. The signal pads 374 are electrically connected to the signal traces 370, and these pads 374 are all on the first face 300 of each circuit board 36. The grounding pads 376 are electrically connected to the grounding traces 372, and these pads 376 are disposed on the first face 300 and the second face 302 of each circuit board 36. Electrical connections between the grounding pads 376 on the opposite faces of the circuit board 36 are made by the grounding traces 372 through conductive vias 38.

The signal traces 370 are coupled to have plural differential pairs on the first face 300. Adjacent differential pairs of the signal traces 370 are separated by the grounding traces 372. The signal traces 370 of the differential pair extend from corresponding signal pads 374 adjacent innermost edges 375, i.e., the signal traces 370 of the differential pair are very closely spaced to have a relatively large distance between adjacent differential pairs, thereby enhancing reduction of crosstalk between adjacent differential pairs. The lowest differential pair has traces 39 on the second face 302 to reduce length and make trace routing easier.

Figure 4:
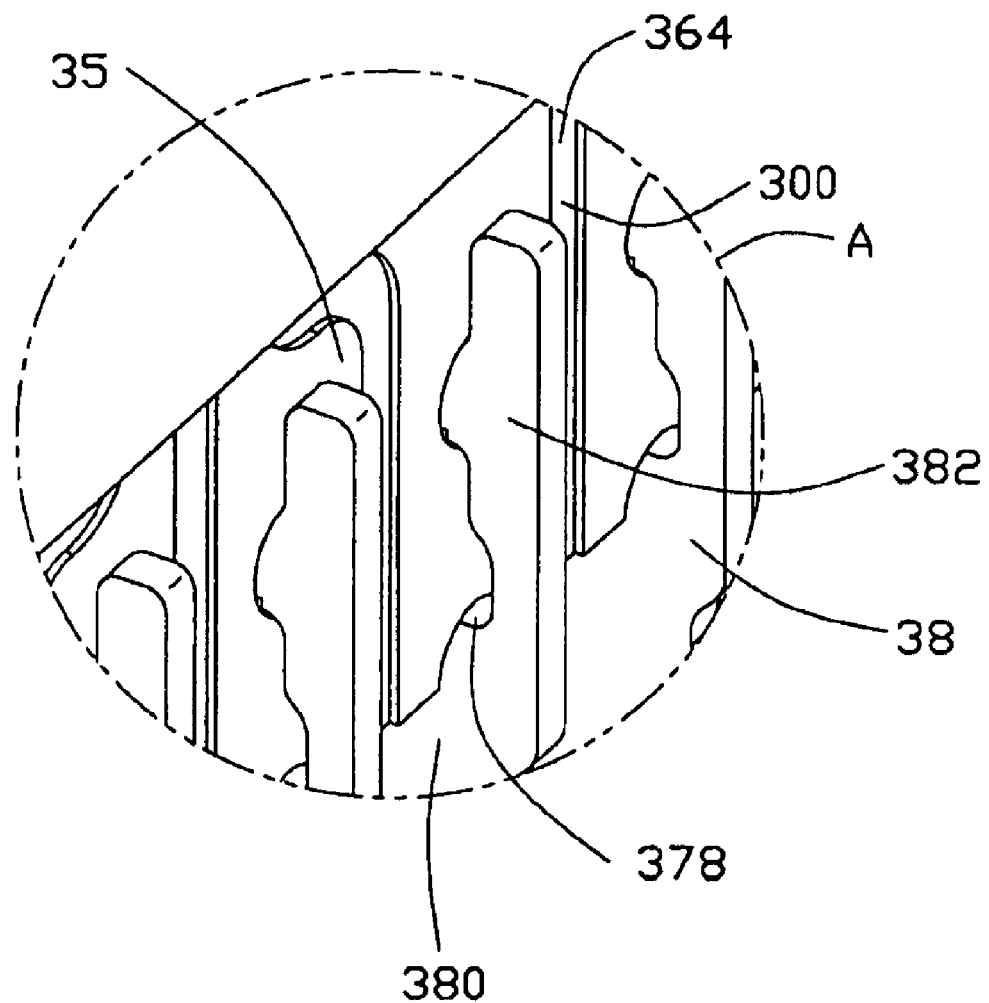
FIG. 4 is an enlarged view of a circled portion A of FIG. 3.

According to one aspect of the invention as shown in FIGS. 3 and 4, the press-fit contacts 38 are secured to the mounting portion 364 of the circuit board 36 by surface mount soldering, which will be described in detail hereinafter.

Figure 10:
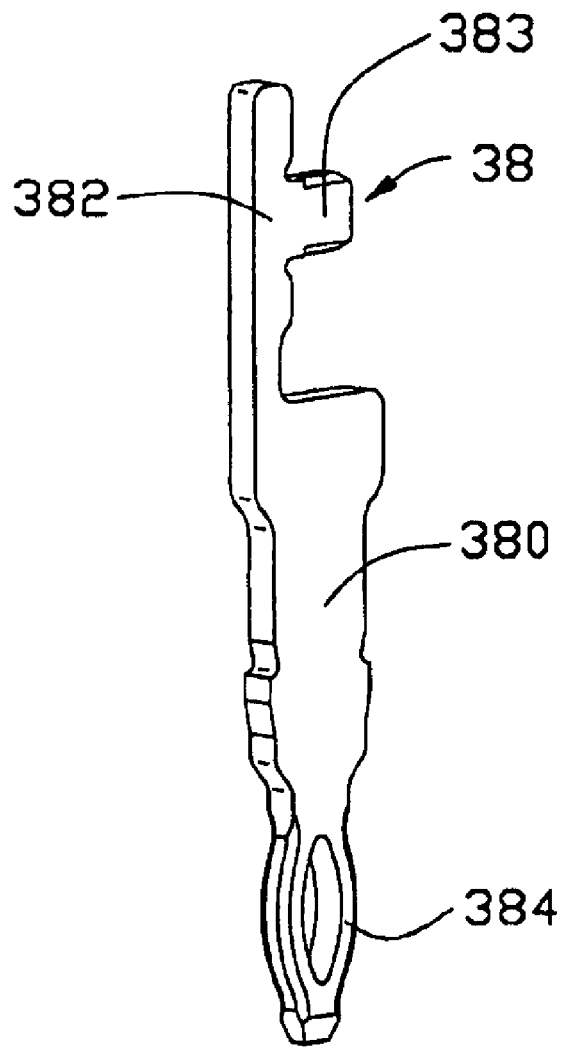
FIG. 10 is a perspective view of a contact used in the connector.

Referring to FIG. 10 in conjunction with FIG. 7, each press-fit contact 38 includes an intermediate portion 380 having an interference fit in a corresponding passageway 14 of the housing 1, a connecting portion 382 extending upwardly from an upper end of the intermediate portion 380 for surface mount soldering to the mounting portion 364 of the circuit board 36, and a compliant tail. 384 extending downwardly from a lower end of the intermediate portion 380 for insertion into the plated through hole of the PCB. The connecting portion 382 is positioned adjacent a first side of the intermediate portion 380 and is formed with a projection 383 extending toward an opposite second side of the intermediate portion 380.

Referring back to FIGS. 8 and 9, according to the invention, the mounting portion 364 of each circuit board 36 defines an upper row of plated through holes 377 for receiving the projections 383 of the press-fit contacts 38 and a lower row of half plated through holes 378 in a bottom edge thereof and aligned with corresponding plated through holes 377 for partially receiving the upper ends of the intermediate portions 380 of the press-fit contacts 38.

FIG. 4 shows the press-fit contacts 38 soldered to the mounting portion 364 of the circuit board 36. The first face 300 of the mounting portion 364 is coated with plural solder pastes 35 which are electrically connected to the corresponding signal and grounding traces 370, 372, respectively. The press-fit contacts 38 are placed on the solder pastes 35 with the projections 383 received in the plated through holes 377 and the upper ends of the intermediate portions 380 received in the half plated through holes 378. After the solder 35 is melt, interstitial space between the projection 383 of the press-fit contact 38 and the corresponding plated through hole 377 of the circuit board 36 is filled with the solder 35. In addition, interstitial space between the intermediate portion 380 and the corresponding half plated through hole 378 of the circuit board 36 is also filled with the solder 35. Therefore, when the melting solder 35 is cooled and solidified, the press-fit contacts 38 are reliably connected with the mounting portion 364 of the circuit board 36, e.g., there is redundant solder connection between the circuit board 36 and the press-fit contact 38 by use of plated through hole 377 and the half plated through hole 378, whereby the circuit board 36 can withstand the compliant insertion forces of the press-fit contacts 38.

It is noted that the shield member 2 in conjunction with the housing 1 obviate the need for a separate box or housing to hold the circuit board modules 3, thereby simplifying the connector 100. It can be understood that the employment of the shield member 2 and the circuit board modules 3 as described in the present invention enhances the electrical and the mechanical performance of the connector 100.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   a unitary insulative housing defining a plurality of parallel slots;
   a plurality of parallelly arranged circuit board modules each comprising a dielectric spacer, a circuit board attached to the dielectric spacer and received in a corresponding slot of the housing, and a row of contacts mechanically and electrically connecting with the circuit board and disposed in the corresponding slot; and
   a shield member attached to the housing, the circuit board modules being retained by and between the shield member and the housing.

2. The electrical connector as claimed in claim 1, wherein the shield member defines a plurality of slots in a top wall thereof, and the dielectric spacers comprise a plurality of protrusions received in the slots to retain upper portions of the circuit board modules.

3. The electrical connector as claimed in claim 2, wherein the housing is vertically spaced from the top wall of the shield member and retains lower portions of the circuit board modules.

4. The electrical connector as claimed in claim 3, wherein the housing defines a plurality of passageways at opposite sides of each slot and extending through a bottom thereof, and the contacts are soldered to the lower portions of the corresponding circuit boards and extend beyond a bottom of the housing through the passageways.

5. The electrical connector as claimed in claim 1, wherein every two adjacent circuit board modules are side to side stackable with use of an extended post on one of the two adjacent dielectric spacers and a recessed hole in another of the two adjacent dielectric spacers.

6. The electrical connector as claimed in claim 1, wherein the shield member is formed with positioning fingers for insertion into corresponding through holes of a printed circuit board.

7. The electrical connector as claimed in claim 6, wherein the shield member comprises a top plate covering a top of the parallel arranged circuit board modules and a rear plate covering a rear of the housing and the circuit board modules, the positioning fingers extending downwardly from the rear plate.

8. The electrical connector as claimed in claim 1, wherein opposite outermost circuit board modules are arranged in such a manner that the dielectric spacers are located at outermost positions.

9. The electrical connector as claimed in claim 1, wherein the housing comprises a front tongue at a lower portion of one end thereof, the front tongue defining a plurality of grooves aligned with corresponding slots, and wherein the circuit boards have mating portions with lower edges received in corresponding grooves.

10. The electrical connector as claimed in claim 1, wherein the housing defines a row of holes adjacent a rear end thereof, and the dielectric spacers of the circuit board modules comprise a plurality of downwardly extending pins received in the holes.

11. The electrical connector as claimed in claim 1, wherein the circuit board is located under the post of the corresponding spacer of the same circuit board modules.

12. A circuit board assembly for using in an electrical connector for high speed signal transmission, comprising:

a circuit board comprising a mating portion adapted for engaging with a complementary element, a mounting portion with a fusible element disposed thereon and defining a plated through hole therein; and a contact including an intermediate portion, a connecting portion extending upwardly from the intermediate portion and surface mounted to the mounting portion, and a tail portion extending downwardly from the intermediate portion adapted for connecting with a printed circuit board, the connecting portion having a projection received in the plated through hole, interstitial space between the plated through hole and the projection being substantially filled with fusible element after melting and solidifying the fusible element.

13. The circuit board assembly as claimed in claim 12, wherein the connecting portion extends adjacent a first side of the intermediate portion, and the projection extends toward an opposite second side of the intermediate portion.

14. The circuit board assembly as claimed in claim 13, wherein the mounting portion defines a half plated through hole at a bottom thereof and aligned with the plated through hole, and the intermediate portion has an upper end received in the half plated through hole, interstitial space between the half plated through hole and the upper end of the intermediate portion being substantially filled with fusible element after melting and solidifying the fusible element.

* * * * *